(12) United States Patent
Feng et al.

(10) Patent No.: US 7,916,499 B2
(45) Date of Patent: Mar. 29, 2011

(54) APPARATUS FOR HOLDING PRINTED CIRCUIT BOARDS

(75) Inventors: Yong-Hui Feng, Shenzhen (CN); I-Hsien Chiang, Taoyuan (TW); Cheng-Hsien Lin, Taoyuan (TW)

(73) Assignees: FuKui Precision Component (Shenzhen) Co., Ltd., Shenzhen, Guangdong Province (CN); Foxconn Advanced Technology Inc., Tayuan, Taoyuan (TW)

( * ) Notice: Subject to any disclaimer, the term of this patent is extended or adjusted under 35 U.S.C. 154(b) by 377 days.

(21) Appl. No.: 12/055,587

(22) Filed: Mar. 26, 2008

(65) Prior Publication Data
US 2009/0045151 A1 Feb. 19, 2009

(30) Foreign Application Priority Data
Aug. 17, 2007 (CN) .......................... 2007 1 0075779

(51) Int. Cl.
*H05K 7/14* (2006.01)
*H05K 7/18* (2006.01)
(52) U.S. Cl. .................. 361/801; 361/760; 361/802
(58) Field of Classification Search .................. 361/760, 361/801–803, 807, 810, 727, 756, 741; 439/607.01, 439/607.41, 607.47; 112/136; 24/455
See application file for complete search history.

(56) References Cited

U.S. PATENT DOCUMENTS

| | | | | |
|---|---|---|---|---|
| 4,255,077 A * | 3/1981 | Smith | ........................... | 414/800 |
| 4,971,676 A * | 11/1990 | Doue et al. | .................... | 118/503 |
| 5,501,436 A * | 3/1996 | Miller | ............................. | 269/47 |
| 6,475,003 B2 * | 11/2002 | Jones et al. | ................... | 439/131 |
| 7,576,980 B2 * | 8/2009 | Lin | .......................... | 361/679.56 |
| 7,663,889 B2 * | 2/2010 | Lajara et al. | ................. | 361/759 |

* cited by examiner

*Primary Examiner* — Hung S Bui
(74) *Attorney, Agent, or Firm* — Andrew C. Cheng (57) ABSTRACT

In one embodiment, a holder for holding printed circuit boards includes a base plate with a plurality of holding unit formed thereon. Each of the holding units includes a spring member, a securing member, and a blocking structure. The spring member includes a first end and a second end. The first end is attached to the base plate. The securing member is slideably mounted on the base plate. The securing member includes a connecting end and a securing end. The connecting end is connected with the second end of the spring member. The blocking structure is located on the base plate. The spring member is configured for pressing the securing member to move toward the blocking structure such that a printed circuit board is retainable between the securing end of the securing member and the blocking structure on the base plate. The holder is capable of holding printed circuit boards in batches.

7 Claims, 10 Drawing Sheets

APPARATUS FOR HOLDING PRINTED CIRCUIT BOARDS

BACKGROUND

1. Technical Field

The present invention relates to an apparatus for holding workpieces, more particularly to an apparatus for holding printed circuit boards, integrated circuit substrates, etc. during a packaging process.

2. Discussion of Related Art

Ball Grid Array (BGA) technology is widely used in packaging of integrated circuits. Generally, a BGA packaging process includes steps of: chip attaching, first plasma cleaning, wire bonding, second plasma cleaning, packaging, solder ball mounting, reflux welding, marking, slicing, and testing. Recently, with the developments in reducing size of integrated circuits, the solder balls are necessarily becoming smaller and smaller, resulting in the solder ball mounting step becoming more and more difficult. During the solder ball mounting step, misalignment of solder balls may occur.

In order to reuse the chip and the substrate of packages in which solder balls are misaligned, the packages must first be cleaned. Usually, the packages are manually cleaned one by one with a hot air gun, which is inefficient.

Therefore, there is a desire to develop a holder for holding the packages such that the packages can be cleaned in batches so as to improve an efficiency of the cleaning process.

SUMMARY

In one embodiment, a holder for holding printed circuit boards includes a base plate with a plurality of holding unit formed thereon. Each of the holding units includes a spring member, a securing member, and a blocking structure. The spring member includes a first end and a second end. The first end is attached to the base plate. The securing member is slideably mounted on the base plate. The securing member includes a connecting end and a securing end. The connecting end is connected with the second end of the spring member. The blocking structure is located on the base plate. The spring member is configured for pressing the securing member to move toward the blocking structure such that a printed circuit board is retainable between the securing end of the securing member and the blocking structure on the base plate.

This and other features and advantages of the present invention as well as the preferred embodiments thereof and a holder in accordance with the invention will become apparent from the following detailed description and the descriptions of the drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF THE PREFERRED EMBODIMENTS

Figure 1:
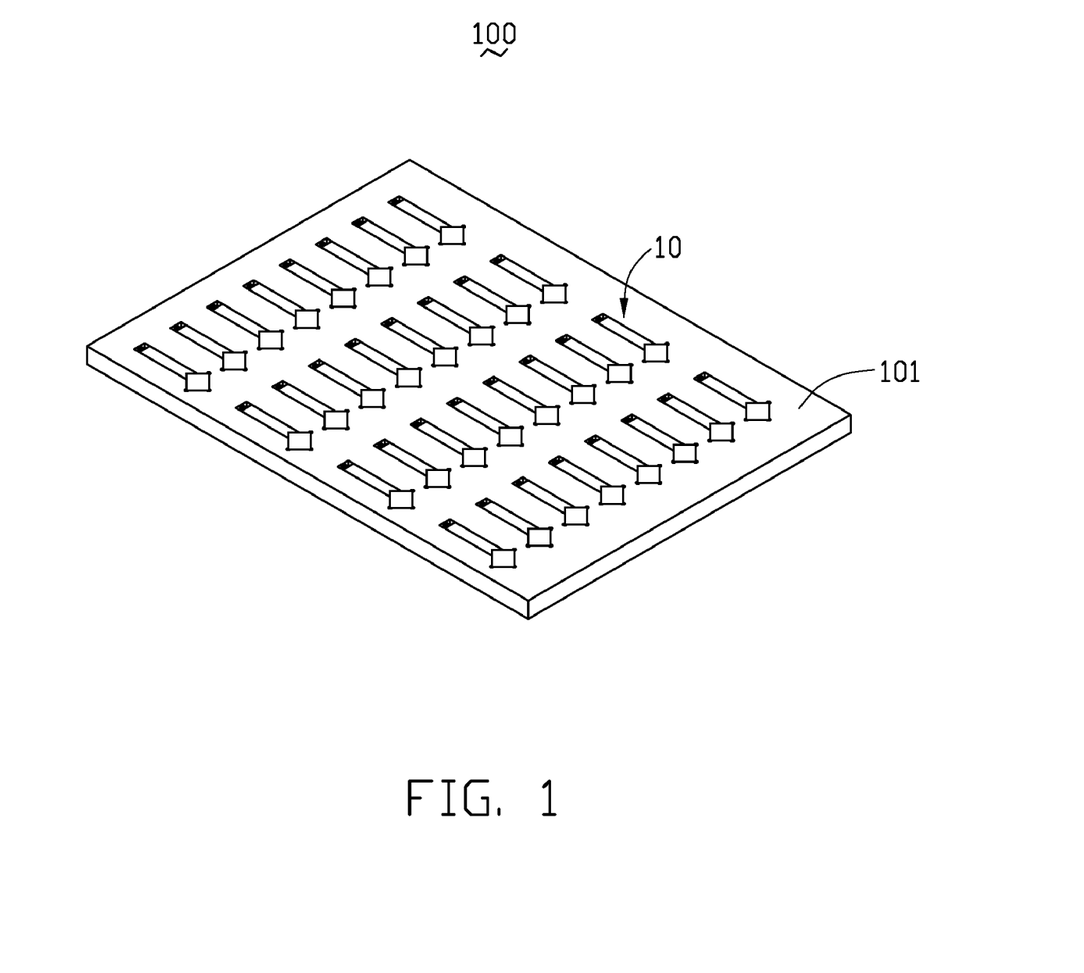
FIG. 1 illustrates a holder including a number of holding units in accordance with a first embodiment.

FIG. 1 illustrates a holder 100 in accordance with a first embodiment. The holder 100 including a supporting plate 101 and a number of holding units 10 formed on the supporting plate 101.

Figure 2:
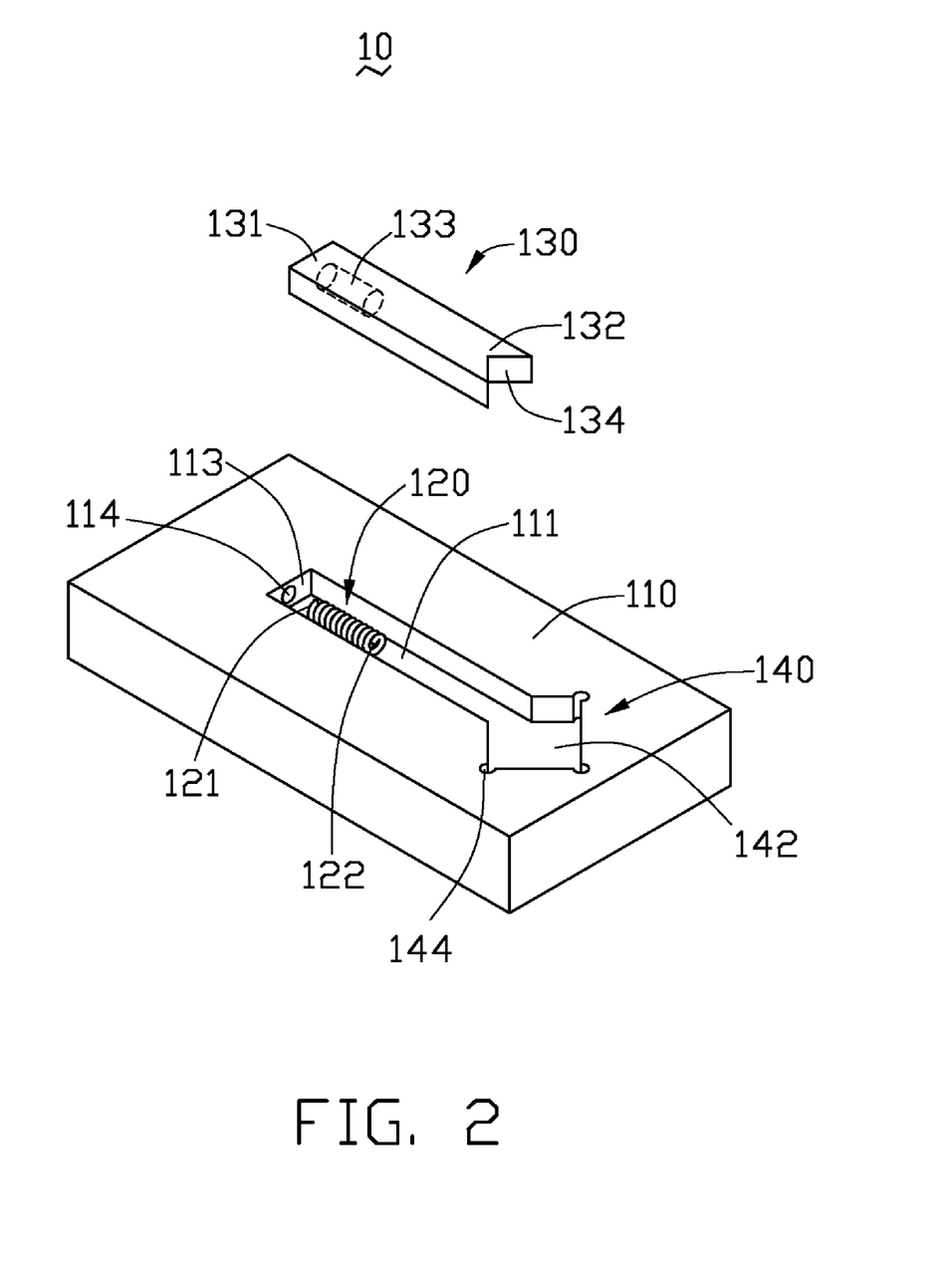
FIG. 2 is an exploded view of a holding unit of the holder of FIG. 1.

Referring to FIG. 2, each holding unit 10 includes a base plate 110, an spring member 120, a securing member 130, and a blocking structure 140. In the first embodiment, the base plate 110 includes a slide groove 111 formed on a surface of the base plate 110. The slide groove 111 is configured for receiving the securing member 130. A sidewall 113 of the base plate 110 is located at one end of the slide groove 111 and a substantially rectangular shaped limitation groove 142 is located at another end of the slide groove 111. A hole 114 extending along a direction away from the slide groove 111 is formed in the sidewall 113. The limitation groove 142 is in communication with the slide groove 111. A cylindrical hole 144 is formed at each corner of the limitation groove 142. The cylindrical hole 144 can allow a tool, such as a tweezer, to clamp a workpiece received in the limitation groove 142.

The spring member 120 includes a first end 121 and a second end 122. The securing member 130 includes a connecting end 131 and a securing end 132. The connecting end 131 includes a receiving hole 133 extending along a lengthways direction of the securing member 130. The receiving hole 133 is configured for receiving the second end 122 of the spring member 120. The securing end 132 includes a V-shaped recess/cutaway portion 134.

Figure 3:
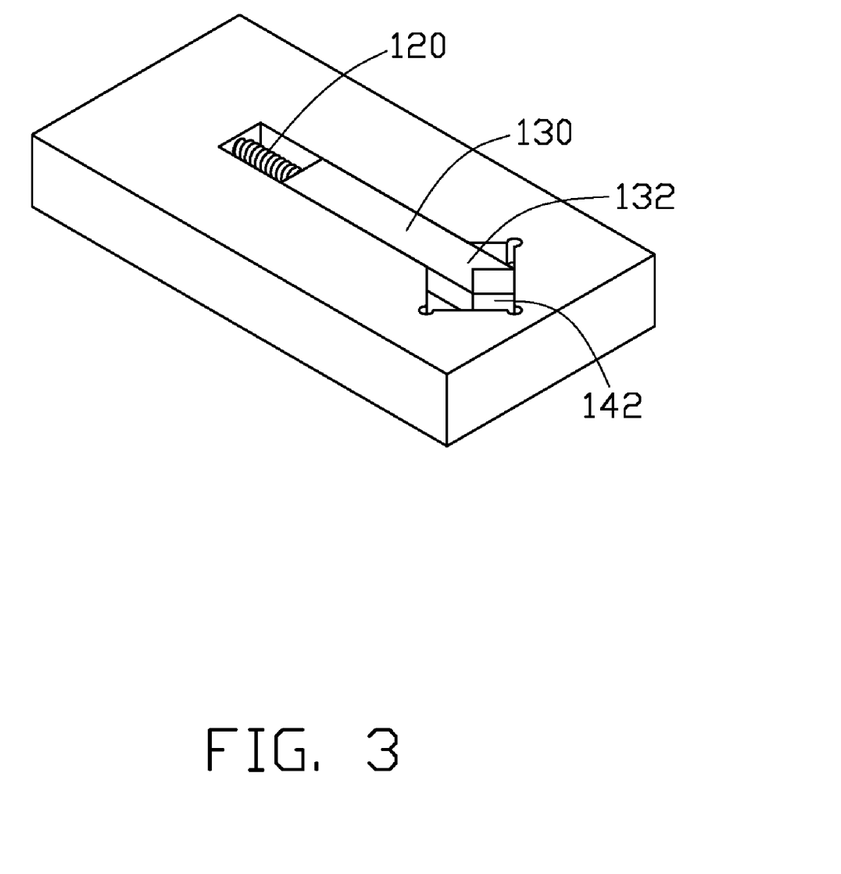
FIG. 3 is an assembled view of the holding unit of FIG. 2.

Referring to FIGS. 2 and 3, the first end 121 and the second end 122 of the securing member 120 are received in the hole 114 and the receiving hole 133 respectively. The securing member 120 is sliderably received in the slide groove 111 and at least a portion of the securing end 132 is disposed in the receiving hole 142.

Figure 4:
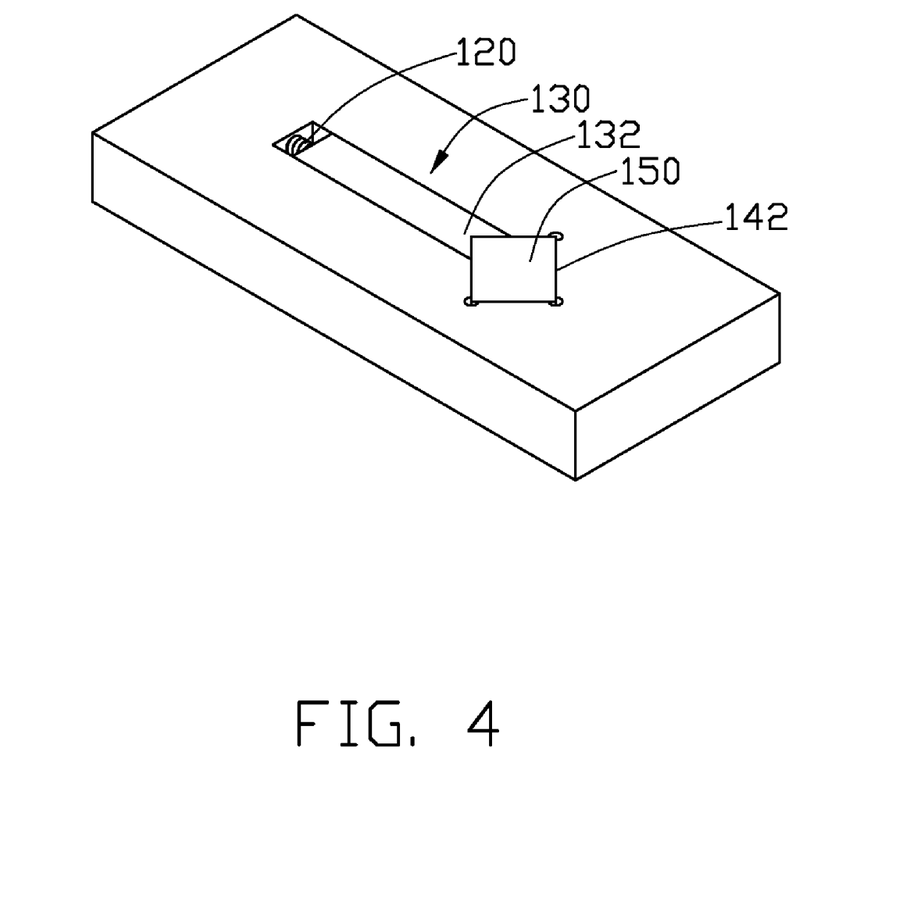
FIG. 4 illustrates a workpiece held in the holding unit of FIG. 3.

Referring to FIG. 4, a workpiece 150, for example, a printed circuit board (PCB), a PCB package etc. is received in the limitation groove 142. The spring member 120 is compressed by the securing member 130, in other words, the spring member 120 provides an spring force to the securing member 130, and as a result, the workpiece 150 is clamped in the limitation groove 142 by the securing end 132.

In the first embodiment, each base plate 110 is a portion of the supporting plate 101, in other words, all the holding units 10 share a same base plate. However, it is understood that each holding units 10 can have its own base plate 110, which can be fixed on the supporting plate 101.

In the holder 100 of the first embodiment, each holding unit 10 is capable of holding a workpiece. Therefore, advantageously and efficiently, a plurality of workpieces such as PCBs, PCB packages etc. can be secured in the holder 100 at the same time and cleaned in batches.

Figure 5:
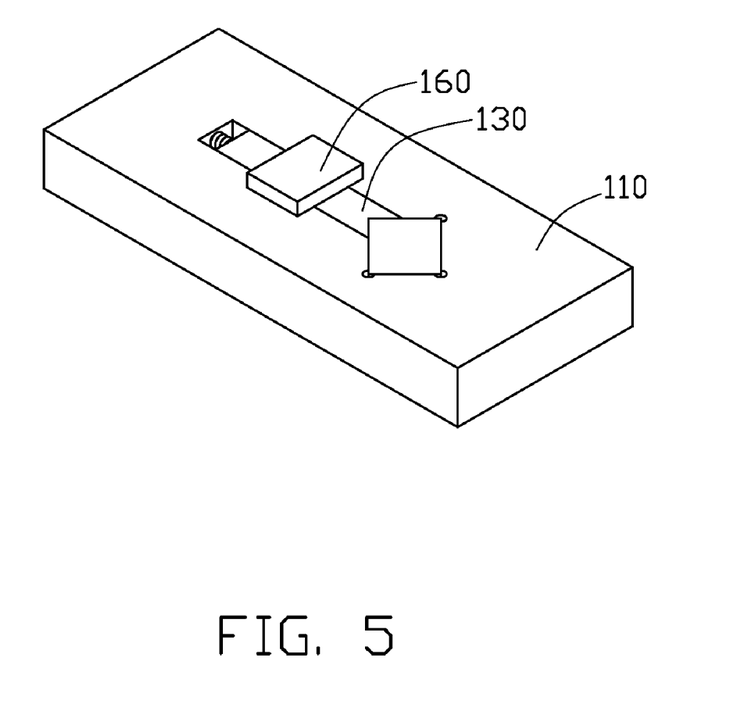
FIG. 5 illustrates the holding unit of FIG. 4 further including a block.

FIG. 5 illustrates a modification of the holding unit 10 of the first embodiment. A block 160 is adapted for limiting the securing member 130 in the slide groove 111. The block 160 can be fixed on the base plate 110 with screws or welded directly on the base plate 110.

Figure 6:
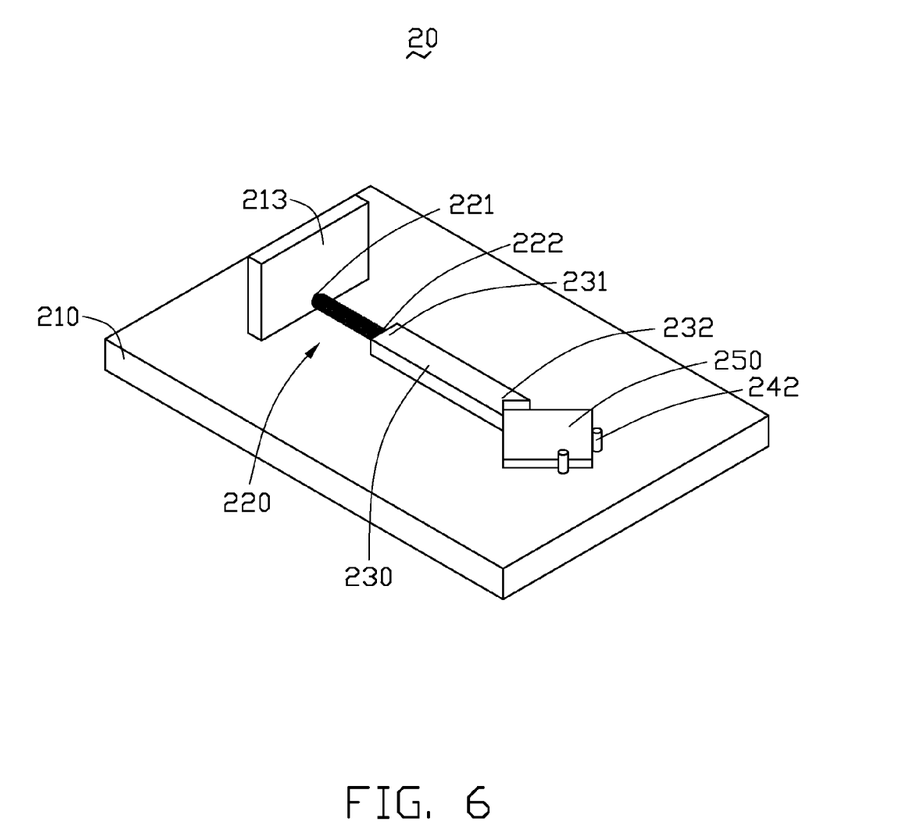
FIG. 6 illustrates a holding unit in accordance with a second embodiment.

FIG. 6 illustrates a holding unit 20 in accordance with a second embodiment. The holding unit 20 includes a base plate 210, an spring member 220, a securing member 230, and a blocking structure 242. The spring member 220 is a spring, which includes a first end 221 and a second end 222. The securing member 230 includes a connecting end 231 and a securing end 232. The first end 221 is fixed to a baffle plate 213, which disposed on the base plate 210. The second end 222 is fixed to the connecting end 231. The blocking structure 242 includes two pegs extending upwardly from the base plate 210. The distance between the baffle plate 213 and the blocking structure 242, the length of the spring member 220, the securing member 230 is predetermined such that if a workpiece 250 is secured between the securing end 232 and the blocking structure 240, the spring member 220 is compressed. The spring member 220 provides an spring force to the securing member 230. As a result, the spring force compels the securing member 230 to move towards the blocking structure 24, thereby the workpiece 250 is tightly secured between the securing end 232 and the blocking structure 240.

Figure 7:
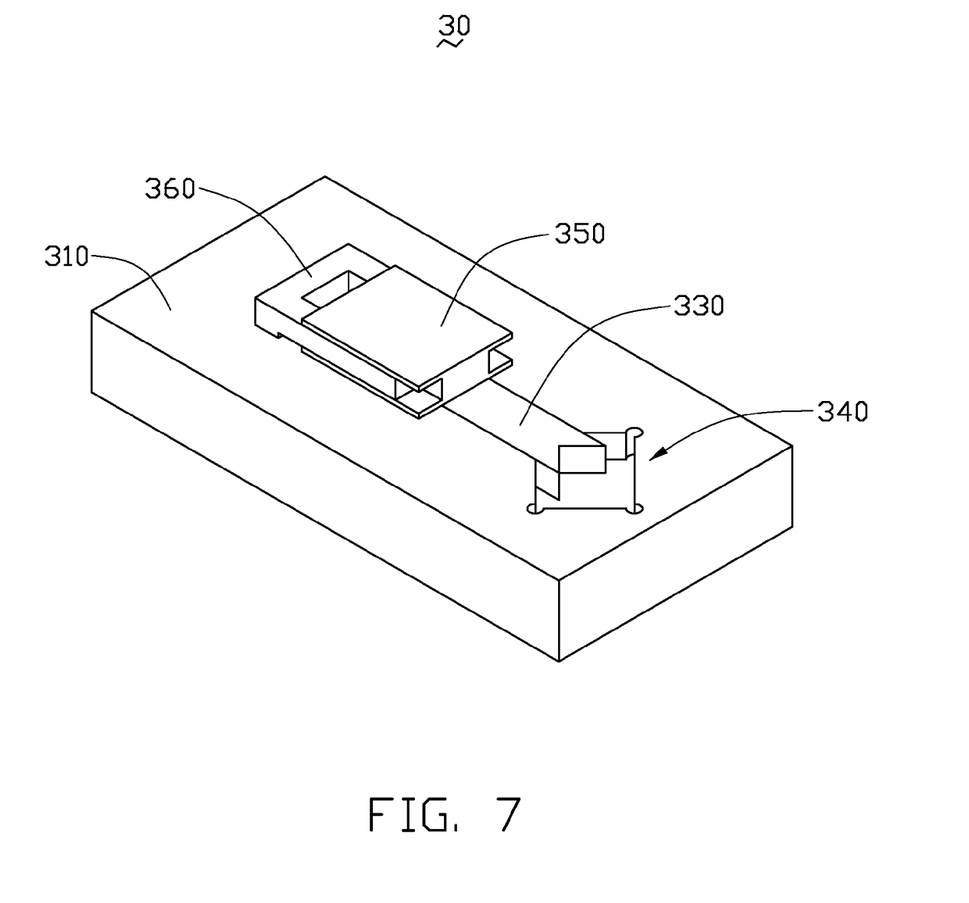
FIG. 7 illustrates a holding unit in accordance with a third embodiment.
Figure 8:
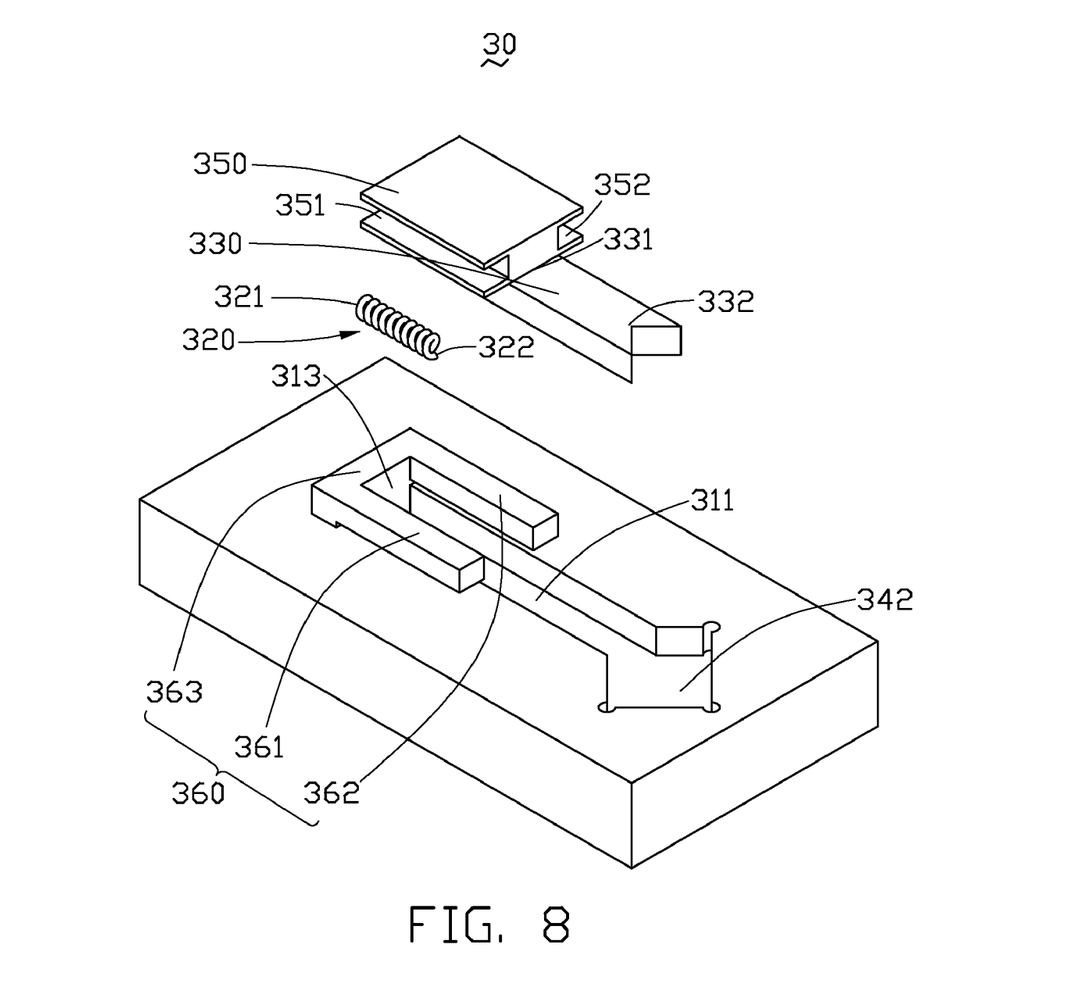
FIG. 8 is an exploded view of the holding unit of FIG. 7.

FIGS. 7 and 8 illustrate a holding unit 30 in accordance with a third embodiment. The holding unit 30 includes a base plate 310, an spring member 320, a securing member 330, a blocking structure 340, a slide block 350, and a guiding rail 360.

The base plate 310 includes a slide groove 311 formed on a surface of the base plate 310. A sidewall 313 is located at an end of the slide groove 311. The spring member 320 includes a first end 321 and a second end 322. The first end 321 is fixed to the sidewall 313 and the second end 322 is fixed to the securing member 330. The securing member 330 includes a securing end 332. The securing end 332 includes a V-shaped cutaway portion. The cross section of the securing member 330 is less than that of the slide groove 311; therefore, the securing member 330 is capable of being slideably mounted in the slide groove 311. The blocking structure 340 includes a groove 342. The groove 342 is in communication with the slide groove 311.

The slide block 350 includes a first groove 351 and a second groove 352 formed in two opposite side surfaces of the slide block 350 respectively. The first groove 351 and the second groove 352 extend along a direction parallel to the lengthways direction of the securing member 330. The guiding rail 360 includes a first track 361, a second track 362, and a supporting portion 363. The supporting portion 363 is fixed, for example, welded on the base plate 310. The first track 361 and the second track 362 are parallel with each other and extend from two ends of the supporting portion 363 respectively. The first track 361 and the second track 362 are cantilevered above the base plate 310. In other words, a distance exists between the base plate 310 and each of the first track 361 and the second track 362. The first track 361 and the second track 362 are sliderably received in the first groove 351 and the second groove 352 respectively, as a result, the slide block 350 is slideably mounted on the guiding rail 360, the securing member 330 can be easily driven using the slide block 350. Preferably, the size of the first track 361 is matched with the size of the first groove 351, and the size of the second track 362 is matched with the size of the second groove 352. In the third embodiment, cross sections of the first track 361 and the second track 362 are rectangular shaped.

Figure 9:
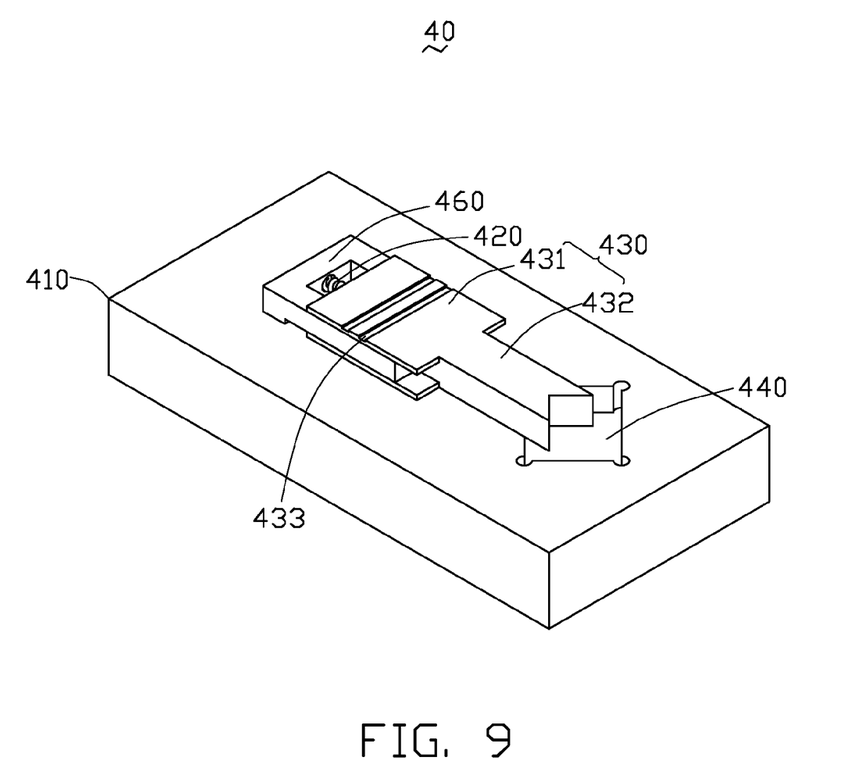
FIG. 9 illustrates a holding unit in accordance with a fourth embodiment.
Figure 10:
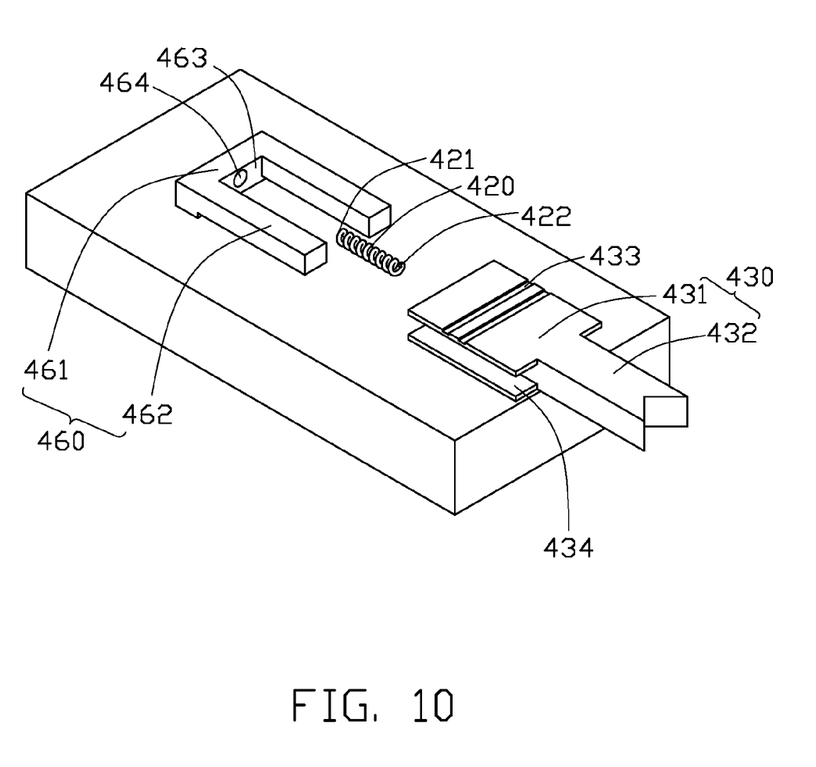
FIG. 10 is an exploded view of the holding unit of FIG. 9.

FIGS. 9 and 10 illustrate a holding unit 40 in accordance with a fourth embodiment; the holding unit 40 includes a base plate 410, an spring member 420, a securing member 430, a blocking structure 440, and a guiding rail 460.

The spring member 420 includes a first end 421 and a second end 422. The securing member 430 includes a slide block portion 431 and a securing portion 432 extending from the slide block portion 431. The slide block portion 431 is similar to the slide block 450 in the third embodiment. The slide block portion 431 includes two grooves 434 formed in two opposite side surfaces of the slide block portion 431. A skidproof structure 433 is formed on a surface of the slide block portion 431. In this embodiment, the skidproof structure 433 includes bar-shaped grooves extending along a direction perpendicular to the lengthways direction of the securing member 430. However, it is to be understood that other patterns can also be used for the skidproof structure 433. The skidproof structure 433 can increase friction between the slide block portion 431 and an operator's hand. As a result, the slide block portion 431 can be easily driven.

The guiding rail 460 includes a first track 461, a second track 462 and a supporting portion 463. The first track 461 and the second track 462 are parallel with each other and extend from two ends of the supporting portion 463 respectively. A hole 464 is defined in the supporting portion 463. The hole 464 is configured for receiving the first end 421 of the spring member 420. The blocking structure 440 is a rectangular shaped groove. In this embodiment, there is no slide groove formed in the base plate 410. The securing member 430 is directly disposed on the base plate 410.

It is understood that the holding units 20, 30, and 40 described in the above embodiments can also be assembled on a supporting plate, similar to the holder 100 illustrated in FIG. 1, so as to constitute a holder including a number of holding units.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention

What is claimed is:

1. A holder for holding printed circuit boards, the holder comprising:
   a base plate with a plurality of holding units formed thereon, each of the holding units comprising:
      a spring member comprising a first end fixed to the base plate and an opposite second end;
      a securing member slidably mounted on the base plate, the securing member comprising a connecting end with the second end of the spring member coupled thereto and a securing end;
      a blocking structure formed on the base plate; and
      a slide block and a guiding rail;
   wherein the guiding rail is fixed on the base plate, the slide block is fixed on the securing member and slidably engaged with the guiding rail, and the spring member is configured for pressing the securing member to move toward the blocking structure such that a printed circuit board is retainable between the securing end of the securing member and the blocking structure on the base plate.

2. The holder as claimed in claim 1, wherein each of the holding units further comprises a guiding groove defined in the base plate, the first end of the spring member is fixed to a sidewall of the guiding groove, and the securing member is slidably received in the guiding groove.

3. The holder as claimed in claim 2, wherein the blocking structure includes a groove defined in the base plate, and the groove of the blocking structure is in communication with the guiding groove.

4. The holder as claimed in claim 1, wherein the guiding rail includes a first rail and an opposite second rail, the slide block includes a first groove and an opposite second groove defined in opposite sides thereof, and the first rail and the second rail are received in the first groove and the second groove respectively.

5. An apparatus for holding a plurality of printed circuit boards, the apparatus comprising:
    a base comprising a plurality of grooves and a plurality of recesses in communication with the respective grooves, two differently oriented retaining side surfaces formed in each of the recesses;
    a plurality of elongated securing members slidably mounted on the base and received in the respective grooves, each of the securing members comprising a first end and an opposite bifurcated second end; and
    a plurality of spring members each comprising a first end fixed to the base plate and an opposite second end associated with the first end of the elongated securing member, the spring members being configured for pushing the elongated securing members to move toward the retaining side surfaces, thereby retaining the printed circuit boards between the second ends of the elongated securing members and the retaining side surfaces.

6. The apparatus as claimed in claim 5, further comprising a plurality of slide blocks and a plurality of guiding rails, wherein each of the guiding rails is fixed on the base, and each slide block is respectively fixed on the elongated securing member and slidably engaged with the guiding rail.

7. The apparatus as claimed in claim 6, wherein each of the guiding rails includes a first rail and an opposite second rail, each slide block includes a first groove and an opposite second groove defined in opposite sides thereof, and the first rail and the second rail are received in the first groove and the second groove respectively.

* * * * *